US008227888B2

(12) United States Patent
Lippert et al.

(10) Patent No.: US 8,227,888 B2
(45) Date of Patent: Jul. 24, 2012

(54) SEMICONDUCTOR COMPONENT WITH COUNTERSIGNAL CIRCUIT FOR PREVENTING CROSSTALK BETWEEN ELECTRONIC ASSEMBLIES

(75) Inventors: Gunther Lippert, Frankfurt an der Oder (DE); Gerald Lippert, Frankfurt an der Oder (DE)

(73) Assignee: IHP GmbH—Innovations for High Performance Microelectronics, Frankfurt (DE)

( * ) Notice: Subject to any disclaimer, the term of this patent is extended or adjusted under 35 U.S.C. 154(b) by 1286 days.

(21) Appl. No.: 11/547,578

(22) PCT Filed: Apr. 8, 2005

(86) PCT No.: PCT/EP2005/051569
§ 371 (c)(1),
(2), (4) Date: Aug. 13, 2007

(87) PCT Pub. No.: WO2005/098951
PCT Pub. Date: Oct. 20, 2005

(65) Prior Publication Data
US 2011/0133303 A1   Jun. 9, 2011

(30) Foreign Application Priority Data
Apr. 8, 2004   (DE) .......................... 10 2004 018 448

(51) Int. Cl.
*H01L 29/00*   (2006.01)
(52) U.S. Cl. ........ 257/500; 257/501; 257/502; 257/537; 257/538; 257/547
(58) Field of Classification Search .................. 257/499, 257/500, 501, 502, 537, 538, 547
See application file for complete search history.

(56) References Cited

U.S. PATENT DOCUMENTS 5,889,314 A * 3/1999 Hirabayashi .................. 257/508
(Continued)

FOREIGN PATENT DOCUMENTS

DE   102 15 328 A1   7/2003
(Continued)

OTHER PUBLICATIONS

Henry H.Y. Chan et al., *Substrate coupled noise reduction and active noise suppression circuits for mixed-signal system-on-a-chip designs*, IEEE 2001 (pp. 154-157).
(Continued)

*Primary Examiner* — Howard Weiss
*Assistant Examiner* — Tifney Skyles
(74) *Attorney, Agent, or Firm* — Ware, Fressola, Van Der Sluys & Adolphson LLP

(57) ABSTRACT

A semiconductor component including a first integrated circuit in a substrate which is adapted to produce electrical signals with a high-frequency signal component, wherein the substrate is such that the high-frequency signal component can propagate on a substrate surface and/or in the substrate interior, a second integrated circuit in the same substrate which is such that its function can be compromised by high-frequency signals, and a countersignal circuit in the same substrate which is adapted to deliver an electrical countersignal which at least at a selected location of the substrate surface and/or the substrate interior attenuates or eliminates the high-frequency electrical signal component emanating from the first integrated circuit, wherein the countersignal circuit includes a receiver which is adapted to produce an electrical signal dependent on the instantaneous field strength of the high-frequency signal component, and a shielding transistor provided in the substrate and having a control electrode and a first field electrode and a second field electrode, whose control electrode is connected on the input side to the receiver and whose first and second field electrodes are acted upon with a predeterminable first and second electrical potential.

23 Claims, 2 Drawing Sheets

U.S. PATENT DOCUMENTS

| | | | |
|---|---|---|---|
| 5,901,023 A | | 5/1999 | Tsuji |
| 6,040,728 A | | 3/2000 | Nelson et al. |
| 6,157,073 A | * | 12/2000 | Lehongres .................... 257/500 |
| 6,327,695 B1 | | 12/2001 | Bothra et al. |
| 2002/0071229 A1 | | 6/2002 | Welbers et al. |
| 2003/0214348 A1 | | 11/2003 | Singh et al. |
| 2004/0113224 A1 | * | 6/2004 | Seki ............................. 257/500 |

FOREIGN PATENT DOCUMENTS

EP   0 817 268 A1   6/1997

OTHER PUBLICATIONS

D. Nührmann, "Das große Werkbuch Elektronik, Band 1," 1998, pp. 705-715.

* cited by examiner

SEMICONDUCTOR COMPONENT WITH COUNTERSIGNAL CIRCUIT FOR PREVENTING CROSSTALK BETWEEN ELECTRONIC ASSEMBLIES

CROSS REFERENCE TO RELATED APPLICATIONS

This application is for entry into the U.S. national phase under §371 for International Application No. PCT/EP2005/051569 having an international filing date of 8 Apr. 2005, and from which priority is claimed under all applicable sections of Title 35 of the United States Code including, but not limited to, Sections 120, 363 and 365(c), and which in turn claims priority under 35 USC §119 to German Patent Application No. 102 004 018 448.8-33 filed 8 Apr. 2004.

BACKGROUND OF THE INVENTION

1. Technical Field

The invention concerns a semiconductor component comprising a first integrated circuit in a substrate which is adapted to produce electrical signals with a high-frequency signal component, wherein the substrate is such that the high-frequency signal component can propagate on a substrate surface and/or in the substrate interior, a second integrated circuit in the same substrate, which is such that the function thereof can be compromised by high-frequency electrical signals, and a countersignal circuit in the same substrate which is adapted to deliver an electrical countersignal which at least at a selected location of the substrate surface and/or of the substrate interior attenuates or eliminates the high-frequency electrical signal component emanating from the first integrated circuit.

2. Discussion of Related Art

Progressive integration in microelectronics, besides a reduction in the component dimensions, also permits novel integration of various functions in a semiconductor device. Due to the development, which has been meteoric especially in recent times, in technologies in microelectronics such as for example the BiCMOS process and in particular the SiGe:C technology (use of a carbon-bearing silicon-germanium alloy in production of the semiconductor device), it is possible for example to combine at the same time highly complex digital circuits and less complex but highly sensitive analog circuits on a substrate.

Hitherto the analog circuits for high-frequency signal processing in receivers and transmitters, for example in the medium and upper GHz range, were implemented using GaAs technology whereas the corresponding digital signal processors were embodied in the less expensive silicon technology.

The development of higher frequency ranges using silicon technology, in particular by virtue of SiGe:C technology, has now made it possible to integrate digital and analog circuits in a single semiconductor device, in particular on a chip based on SiGe:C technology. Integration in a single chip results in a reduction in the surface area required and thus results in shorter conduction paths, which in turn permits an increase in the operating speed of the chip and reduces current consumption.

The signal/noise ratio can be markedly increased. A further advantage of integration is that the costly GaAs technology can be avoided.

Therefore the above-indicated integration, by virtue of the short paths and the reduced current consumption, considerably increases the functionality of the integrated semiconductor device.

At the present time however, because of the problems which have not yet been resolved in the state of the art, such as in particular mutual crosstalk of the signals of the two circuit portions, the advantages of such integration cannot yet be used in a practical context. The term crosstalk is used here to denote capacitive or inductive coupling of in particular high-frequency signal components of a first circuit, as an interference signal, into a second circuit. In the second circuit the interference signal is superimposed on the actual signal, that is to say the signal which is generated or which is to be processed in the second circuit.

In that respect, in most cases the substrate in which the integrated circuits are provided is of such a nature that the high-frequency signal component can propagate on a substrate surface or in the substrate interior or both on a substrate surface and also in the substrate interior. Those propagation alternatives are also combined together in the context of this application by the abbreviating expression 'on a substrate surface and/or in the substrate interior'.

SOI-substrates which can reduce crosstalk by virtue of the embedded insulator layer require an increased level of process complication and expenditure in manufacture and cannot completely suppress capacitive coupling of high-frequency interference fields. Relatively good passive shielding is achieved with an earthed ground shielding for example in the form of a buried channel.

In digital circuits, high-frequency alternating fields occur for example due to clock generation in the digital processor. The clock frequency itself is for example frequently about 40 MHz. That frequency can already be found to cause disturbance in adjacent sensitive analog circuits and in the context of this application is referred to as high-frequency. In addition alternating fields produced by digital circuits, because of the steep edges of the clock signal, have a frequency spectrum with a particularly pronounced signal component in the high-frequency spectral range above the clock frequency itself. High-frequency interference fields can however also be caused by signals in an intermediate frequency range. As is known, intermediate frequency signals are produced in the production of a radio signal to be emitted in a transmitter circuit. The frequency thereof can be for example 800 MHz while the actual transmission frequency is in the gigahertz range.

By way of example voltage-control oscillators and signal generators, as in the above-mentioned example of clock signal generation, are considered as a source for interference signals which are produced in digital circuits.

High-frequency alternating fields produced by digital circuits are received for example by a highly sensitive amplifier (low noise amplifier—LNA) of an analog circuit portion and amplified in such a way as to result in unwanted superimposition phenomena with the actual signal of the analog circuit portion. Such superimposition phenomena worsen the signal quality or completely prevent functioning of the analog circuit. Crosstalk has an effect in particular when there are small spacings between two circuits integrated in a substrate and is therefore in conflict with a reduction in the size of the structures in a chip.

Known approaches for reducing crosstalk involve separating the circuits which influence each other in terms of interference (for example analog and digital circuits), that is to say providing them in two different chips, or keeping the spacings between two circuits as large as possible. A further approach involves suppressing the interference signal by insulator layers between the circuits (see SOI). Semiconductor devices in which such approaches are used are described for example in EP 0 817 268.

DE 102 15 328 A1 proposes providing a countersignal circuit in a semiconductor component having a first and a second integrated circuit. The object of the countersignal circuit described therein is to produce a countersignal which leads to suppression of an interference signal. The countersignal circuit of DE 102 15 328 A1 is however not described in terms of its structural configuration.

DISCLOSURE OF INVENTION

The technical problem on which the present invention is based is to provide an alternative semiconductor device having a digital and an analog circuit portion, in which the effects of interference signals can be actively reduced.

That object is attained by a semiconductor component comprising
- a first integrated circuit in a substrate which is adapted to produce electrical or electromagnetic signals with a high-frequency signal component, wherein the substrate is such that at least a part of the high-frequency signal component can propagate on a substrate surface or in the substrate interior in the form of a high-frequency electrical or electromagnetic interference signal,
- a second integrated circuit in the same substrate which is such that its function can be compromised by the high-frequency interference signal, and
- a countersignal circuit in the same substrate which is adapted to deliver a high-frequency electrical or electromagnetic countersignal which at least at a selected location of the substrate surface or of the substrate interior attenuates or eliminates the interference signal from the first integrated circuit, wherein the countersignal circuit includes the following elements:
- a receiver which is adapted to produce an electrical signal dependent on the instantaneous field strength of the interference signal, and
- a shielding transistor provided in the substrate and having a control electrode and a first field electrode and a second field electrode, whose control electrode is connected on the input side to the receiver and whose first and second field electrodes are acted upon with a predeterminable first and second electrical potential respectively.

In the semiconductor component according to the invention the countersignal circuit includes a receiver which is adapted to produce an electrical receiver signal dependent on the instantaneous field strength of the high-frequency signal component. In addition the countersignal circuit of the semiconductor component according to the invention includes a shielding transistor provided in the substrate and having a control electrode and a first field electrode and a second field electrode, whose control electrode is connected on the input side to the receiver and whose first and second field electrodes are acted upon with a predeterminable first and second electrical potential respectively.

In the semiconductor component according to the invention two field electrodes of a shielding transistor, by virtue of the electrical potential which acts upon them, provide for a countersignal in the form of a location-dependent and time-dependent counterfield at the substrate surface and in the substrate interior.

The countersignal is superimposed on the interference signal. Extinction is achieved by superimposition in phase opposition of alternating fields of equal amplitude. If the phase or amplitude of the countersignal and the interference signal are not completely coincident at least attenuation of the interference signal is achieved by superimposition of the two fields.

The magnitude and the sign of the gate voltage controls the counterfield. The potentials at the field electrodes such as for example the source and the drain in the case of a field effect (FET) shielding transistor are selected in consideration of the circuit elements of the second integrated circuit, which are in the range of the interference signal, the doping and the geometrical dimensions of the individual structural elements of the various components, such as for example a base layer of a heterobipolar transistor, as well as the amplitude to be expected and the frequency spectrum to be expected in respect of the interference signal.

As the shielding transistor has a control electrode which is connected on the input side to the receiver of the interference signal, the counterfield, with a suitable choice of the electrical potential between the field electrodes, will cause attenuation or elimination of the high-frequency electrical alternating field which is caused by the high-frequency signal component of the first electrical circuit on the substrate surface or in the substrate.

In that way it is possible to effect attenuation or elimination of the interference field formed by the interference signal, by superimposition in phase opposition of the counter-alternating field produced between the field electrodes and the interference field formed by the interference signal.

It will be appreciated that complete extinction of the interference field by the counterfield of the shielding transistor is not effected everywhere in the substrate but generally at a predeterminable location within the substrate or at the substrate surface. Attenuation of the interference field is achieved in the area surrounding that location by virtue of a phase opposition relationship of the signals, which is generally no longer exactly achieved there, and that attenuation is also suitable for at least reducing interference with the function of the second integrated circuit. A plurality of shielding transistors can be provided for interference elimination of a larger substrate region, in which respect consideration is to be given here to the fact that the counterfields of the different shielding transistors are also superimposed and in accordance with the invention are incorporated into interference signal suppression.

In a preferred embodiment of the semiconductor component according to the invention the first field electrode is acted upon with a potential whose magnitude is predetermined in dependence on the expected electrical field strength of the high-frequency signal component.

In a further embodiment the second field electrode is acted upon with a ground potential. Noise in the substrate can be suppressed by connecting the second field electrode to ground.

In an alternative embodiment the second field electrode is acted upon with an electrical potential which is equal in magnitude to the electrical potential of the first field electrode but is of opposite polarity.

In a further embodiment there is provided a first control circuit which is connected at the input side to the receiver and at the output side to the control electrode or the gate electrode and which is adapted to influence amplitude and phase of the countersignal by means of a control signal delivered to the control electrode or gate electrode.

In a further preferred embodiment there is provided a second control circuit which is connected at the input side to the receiver and which is adapted to act on the first or the first and the second field electrode with an electrical potential which depends on the signal delivered by the receiver. In this embodiment the gate electrode not only controls the strength of the electrical counterfield. In addition, the output signal of the receiver also serves to establish the potential of the first field electrode or both field electrodes.

The first and second control circuits can be integrated in a single control circuit.

The shielding transistor can alternatively be in the form of a bipolar transistor or a field effect transistor. An embodiment in the form of a field effect transistor is preferred.

When in the form of a field effect transistor the gate electrode of the field effect transistor preferably forms the control electrode, the source electrode of the field effect transistor forms the first field electrode and the drain electrode of the field effect transistor forms the second field electrode. Frequency, phase and amplitude of the countersignal are controlled by means of the gate electrode. The signal which is produced by the receiver and which is a measure in respect of frequency, phase and amplitude of the interference signal at the location of the receiver serves for control purposes. That circuit is sufficiently fast to ensure, in the frequency regime which is relevant here, correlation between the field of the interference signal and the oppositely directed field of the countersignal, which causes extinction or attenuation of the interference signal by superimposition with the countersignal in phase opposition or approximately in phase opposition.

In a further embodiment the shielding transistor can be arranged between the first and the second integrated circuits. In an embodiment which is an alternative thereto the second integrated circuit can be arranged in the substrate between doping regions of the field effect transistor, which are associated with the source electrode and the drain electrode. In a field effect transistor the counterfield is produced between the doping regions of the source and the drain. Arranging the second integrated circuit between those doping regions therefore signifies that the second circuit is arranged directly at the location of the greatest attenuation or even elimination of the interfering alternating field. In this embodiment the spacing of the doping regions of the field effect transistor is preferably markedly greater than in conventional field effect transistors and can be up to 2 mm.

In a further embodiment of the semiconductor component according to the invention the field effect transistor has a first doping region associated with the source electrode and a second doping region associated with the drain electrode. The extent of the doping regions in a depth direction from the substrate surface towards the substrate interior is greater than the greatest extent of structural elements of the first and second integrated circuits in the depth direction. That particularly efficiently suppresses propagation of the interfering alternating field.

The receiver of the countersignal circuit of the semiconductor component according to the invention can be arranged alternatively either between the first and the second integrated circuits. Alternatively it can be arranged near the second integrated circuit. As a further alternative it can be in the form of a constituent part of the second integrated circuit. When the shielding transistor is arranged between the first and the second integrated circuits the receiver can be provided between the first integrated circuit and the shielding transistor.

Preferably the receiver is in the form of an antenna which is tuned to a frequency spectrum embraced by the interference signal.

In a further embodiment the extent of the receiver in a depth direction from the substrate surface towards the substrate interior is selected to be greater than the depthwise extent of the second integrated circuit which for example can be a sensitive analog circuit portion.

A further preferred embodiment of the semiconductor component according to the invention has a countersignal circuit with two or more shielding transistors.

In that case the countersignal circuit can also include two or more receivers. In that situation different shielding transistors are controlled by means of different receivers.

In a further embodiment a plurality of shielding transistors are controlled by means of one and the same receiver, insofar as the control electrodes of two or more shielding transistors of the countersignal circuit are connected to the same receiver.

BRIEF DESCRIPTION OF THE DRAWINGS

Further embodiments by way of example of the invention are described hereinafter with reference to the Figures in which.

DETAILED DESCRIPTION

Figure 1:
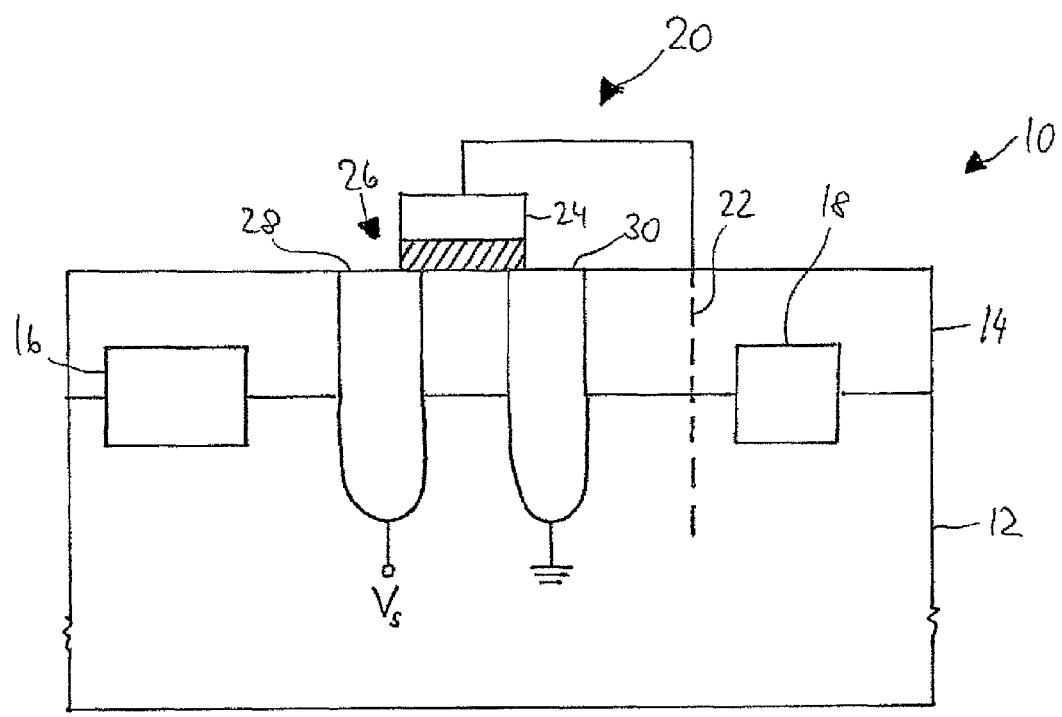
FIG. 1 shows a first embodiment of a semiconductor component with an MOSFET shielding transistor.

FIG. 1 shows a first embodiment of a semiconductor component 10 with an MOSFET shielding transistor. The semiconductor component 10 is formed in a substrate 12. The substrate 12 is for example a heavily doped $p^+$-substrate on which is deposited an active layer 14 in which different integrated circuits are provided. Two integrated circuits 16 and 18 are shown in the form of blocks as a diagrammatic representation. The first integrated circuit 16 is a digital circuit. It typically produces electrical signals in pulse form or square-wave form. The electrical signals can assume maximum voltage values of for example about 2.5 V. Harmonics of such signals are frequently measured in digital circuits at a frequency in the range of between 100 MHz and some GHz. The Fourier spectrum of an individual square-wave pulse has high-frequency signal components, the frequencies of which can be markedly above 100 MHz and for example 60 GHz. Signal components of that kind couple from the circuits in which they are produced and from the lines over which they are propagated within the first integrated circuit 16 or between the first integrated circuit 16 and other integrated circuits on the substrate (not shown), into the active layer 14 and the substrate 12. Here those alternating fields can propagate in the direction of the second integrate circuit.

In the present embodiment the second integrated circuit 18 is a highly sensitive analog circuit such as for example a highly sensitive amplifier. Alternating fields which are propagated over the substrate or the active layer to the second integrated circuit 18 are admittedly attenuated as a consequence of damping by the impedance along the propagation path. However interference voltage amplitudes in the region of 100 microvolts are certainly possible and thus markedly surpass the analog signals to be amplified, for example of an LNA (low noise amplifier). The alternating fields can be coupled inductively or capacitively from the substrate into the second integrated circuit 18.

To attenuate or avoid a coupling-in effect as just described in respect of interference fields into the second integrated circuit 18 a countersignal circuit 20 is provided in the semiconductor component 10. The countersignal circuit 20 includes a receiver 22 in the substrate. The receiver 22 is for example an antenna which is tuned to alternating fields emitted in the frequency range of the digital circuit 16. This therefore involves a for example metallic element of a suitably selected geometrical configuration. The receiver 22 is connected to a control electrode 24 of a shielding transistor 26 which is in the form of an MOSFET transistor. The MOSFET transistor 26 has a source electrode 28 and a drain electrode 30. Details of contacting and voltage supply are not shown in FIG. 1 for the sake of simplicity. A source voltage Vs is applied to the source electrode 28. That is constant in the present embodiment. Alternatively it can also be variable by way of a control circuit (not shown). By way of example a mean value, determined over a predetermined period of time, of the magnitude of the signal delivered by the receiver 22 to the gate electrode 24 can be used as the parameter which is involved for controlling the source voltage by means of a control circuit.

In the present embodiment the drain electrode 30 is at ground potential. This variant has the advantage that the greatest part of the interference field is taken away to ground and the counterfield to be produced can be kept relatively small in comparison with the interference field. The amplitude of the interference field is therefore reduced by being taken away to ground so that the resulting smaller interference field can be compensated by a counterfield whose amplitude is also less than in a situation in which a drain electrode is not at ground potential. A particularly small amount of energy is therefore required to produce the countersignal.

The control electrode 24 controls an electrical alternating field in the region of the substrate 12 and the active layer 14 between the source 28 and the drain 30. The field is so adapted in magnitude and phase, if necessary by means of an additional control circuit, that it produces a counterfield in relation to the propagating interference field of the digital circuit 16. The situation involves superimposition of the interference field and the counterfield produced by the shielding transistor. That leads to attenuation or extinction of the interference field in a predetermined region of the substrate. Coupling of the gate voltage to the interference signal by way of the receiver is effected in the nanosecond range and is thus sufficiently fast to be able to always maintain conditions involving phase opposition or approximately phase opposition.

Figure 2:
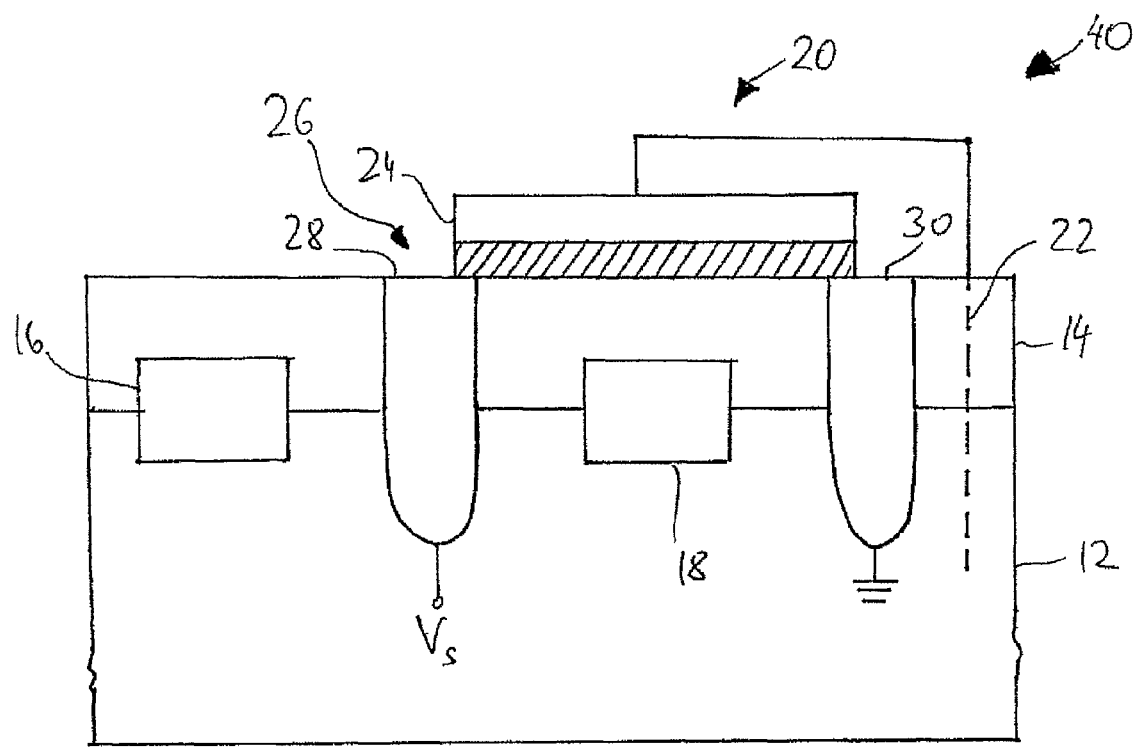
FIG. 2 shows a second embodiment of a semiconductor component with an MOSFET shielding transistor.

FIG. 2 shows a second embodiment which is the same as that shown in FIG. 1 in numerous features. Therefore the same references are used for the same structural elements in FIG. 2 as in FIG. 1.

The essential difference between the semiconductor component 40 of FIG. 2 and the semiconductor component 10 of FIG. 1 is that the second integrated circuit 18 is arranged between the doping regions of the source 28 and the drain 30 and beneath the gate electrode 24. In this arrangement the analog circuit 18 is disposed directly in the region in which the amplitude of the counterfield is at its greatest, more specifically between the source and the drain electrodes 28 and 30. This arrangement can provide for particularly effective suppression of interference fields. Admittedly the receiver 22 is outside that field. However by virtue of suitable calibration the gate electrode 24 can be actuated in such a way that it produces a control field between the source 28 and the drain 30, which is suitable for extinguishing interference fields in the region of the integrated circuit 18. The receiver 22 can also be arranged between the first integrated circuit 16 and the shielding transistor 26. That structure serves in extremely sensitive circuits to achieve field freedom.

What is claimed is:

1. A semiconductor component (10, 40) comprising
a first integrated circuit (16) in a substrate (12, 14) which is adapted to produce electrical or electromagnetic signals with a high-frequency signal component, wherein the substrate (12, 14) is such that at least a part of the high-frequency signal component can propagate on a surface of the substrate or in an interior of the substrate or both on the substrate surface and also in the substrate interior in the form of a high-frequency electrical or electromagnetic interference signal,
a second integrated circuit (18) in the same substrate (12, 14) which is such that its function can be compromised by the high-frequency interference signal, and
a countersignal circuit (20) in the same substrate (12, 14) which is adapted to deliver a high-frequency electrical or electromagnetic countersignal which at least at a selected location of the substrate surface or of the substrate interior (12, 14) or both of the substrate surface and also the substrate interior attenuates or eliminates the interference signal,
wherein the countersignal circuit (20) includes the following elements;
a receiver (22) which is adapted to produce an electrical receiver signal dependent on the instantaneous field strength of the high-frequency signal component, and
a shielding transistor (26) provided in the substrate and having a control electrode (24) and a first field electrode (28) and a second field electrode (30), whose control electrode (24) is connected on the input side to the receiver (22) and whose first and second field electrodes (28, 30) are acted upon with a predeterminable first and second electrical potential respectively,
wherein the shielding transistor is in the form of a field effect transistor (26), and
wherein the second integrated circuit (18) is arranged in the substrate between doping regions (28, 30) of the field effect transistor (26), which are associated with the source and the drain electrodes.

2. A semiconductor component as set forth in claim 1 wherein the shielding transistor (26) is adapted to produce a countersignal which at least at a location in the substrate or at the substrate surface corresponds in amplitude and frequency to at least one component of the interference signal and whose phase is shifted either through 180 degrees or through approximately 180 degrees with respect to the at least one component of the interference signal.

3. A semiconductor component as set forth in claim 1 wherein the first field electrode (28) is acted upon with a potential ($V_s$) whose magnitude is predetermined in dependence on at least one of the following parameters: the expected electrical field strength of the interference signal, the electrical conductivity of the substrate or at least one layer contained in the substrate, the dimensions of the second integrated circuit, and the component density in the first or second integrated circuit.

4. A semiconductor component as set forth in claim 1 wherein the second field electrode (30) is acted upon with ground potential.

5. A semiconductor component as set forth in claim 1 wherein the second field electrode (30) is acted upon with an electrical potential which in magnitude is equal to the electrical potential of the first field electrode but is of opposite polarity.

6. A semiconductor component as set forth in claim 1 wherein the gate electrode (24) of the field effect transistor (26) forms the control electrode, the source electrode (28) of the field effect transistor forms the first field electrode and the drain electrode (30) of the field effect transistor forms the second field electrode.

7. A semiconductor component as set forth in claim 1 wherein there is provided a first control circuit which is connected at the input side to the receiver (22) and at the output side to the control electrode or the gate electrode (24) and which is adapted to influence amplitude and phase of the countersignal by means of a control signal delivered to the control electrode or the gate electrode (24).

8. A semiconductor component as set forth in claim 1 with doping regions of the field effect transistor (28, 30) which are associated with the source and the drain electrodes and whose extent in a depthwise direction from the substrate surface towards the substrate interior is greater than the greatest extent of structural elements of the first integrated circuit (16) and the second integrated circuit (18) in the depthwise direction.

9. A semiconductor component as set forth in claim 1 wherein the countersignal circuit includes two or more shielding transistors.

10. A semiconductor component (10, 40) comprising
a first integrated circuit (16) in a substrate (12, 14) which is adapted to produce electrical or electromagnetic signals with a high-frequency signal component, wherein the substrate (12, 14) is such that at least a part of the high-frequency signal component can propagate on a surface of the substrate or in an interior of the substrate or both on the substrate surface and also in the substrate interior in the form of a high-frequency electrical or electromagnetic interference signal,
a second integrated circuit (18) in the same substrate (12, 14) which is such that its function can be compromised by the high-frequency interference signal, and
a countersignal circuit (20) in the same substrate (12, 14) which is adapted to deliver a high-frequency electrical or electromagnetic countersignal which at least at a selected location of the substrate surface or of the substrate interior (12, 14) or both of the substrate surface and also the substrate interior attenuates or eliminates the interference signal,
wherein the countersignal circuit (20) includes the following elements:
a receiver (22) which is adapted to produce an electrical receiver signal dependent on the instantaneous field strength of the high-frequency signal component, and
a shielding transistor (26) provided in the substrate and having a control electrode (24) and a first field electrode (28) and a second field electrode (30), whose control electrode (24) is connected on the input side to the receiver (22) and whose first and second field electrodes (28, 30) are acted upon with a predeterminable first and second electrical potential respectively,
wherein the receiver (22) is in the form of an antenna which is tuned to a frequency spectrum embraced by the interference signal.

11. A semiconductor component as set forth in claim 10 wherein the shielding transistor is in the form of a bipolar transistor.

12. A semiconductor component as set forth in claim 10 wherein the shielding transistor (26) is arranged in the substrate between the first integrated circuit (16) and the second integrated circuit (18).

13. A semiconductor component as set forth in claim 10 wherein the receiver (22) is arranged near the second integrated circuit.

14. A semiconductor component as set forth in claim 10 wherein the receiver (22) is in the form of a constituent part of the second integrated circuit (18).

15. A semiconductor component as set forth in claim 10 wherein the extent of the receiver (22) in a depthwise direction from the substrate surface towards the substrate interior is so selected that at least the predominant proportion is of a greater extent than the second integrated circuit (18).

16. A semiconductor component as set forth in claim 10 wherein the shielding transistor (26) is adapted to produce a countersignal which at least at a location in the substrate or at the substrate surface corresponds in amplitude and frequency to at least one component of the interference signal and whose phase is shifted either through 180 degrees or through approximately 180 degrees with respect to the at least one component of the interference signal.

17. A semiconductor component as set forth in claim 10 wherein the first field electrode (28) is acted upon with a potential ($V_s$) whose magnitude is predetermined in dependence on at least one of the following parameters: the expected electrical field strength of the interference signal, the electrical conductivity of the substrate or at least one layer contained in the substrate, the dimensions of the second integrated circuit, and the component density in the first or second integrated circuit.

18. A semiconductor component as set forth in claim 10 wherein the countersignal circuit includes two or more shielding transistors.

19. A semiconductor component (10, 40) comprising a first integrated circuit (16) in a substrate (12, 14) which is adapted to produce electrical or electromagnetic signals with a high-frequency signal component, wherein the substrate (12, 14) is such that at least a part of the high-frequency signal component can propagate on a surface of the substrate or in an interior of the substrate or both on the substrate surface and also in the substrate interior in the form of a high-frequency electrical or electromagnetic interference signal, a second integrated circuit (18) in the same substrate (12, 14) which is such that its function can be compromised by the high-frequency interference signal, and a countersignal circuit (20) in the same substrate (12, 14) which is adapted to deliver a high-frequency electrical or electromagnetic countersignal which at least at a selected location of the substrate surface or of the substrate interior (12, 14) or both of the substrate surface and also the substrate interior attenuates or eliminates the interference signal, wherein the countersignal circuit (20) includes the following elements: a receiver (22) which is adapted to produce an electrical receiver signal dependent on the instantaneous field strength of the high-frequency signal component, and a shielding transistor (26) provided in the substrate and having a control electrode (24) and a first field electrode (28) and a second field electrode (30), whose control electrode (24) is connected on the input side to the receiver (22) and whose first and second field electrodes (28, 30) are acted upon with a predeterminable first and second electrical potential respectively, wherein the countersignal circuit includes two or more receivers, wherein the control electrodes of two or more shielding transistors of the countersignal circuit are connected to the same receiver.

20. A semiconductor component as set forth in claim 19 wherein the shielding transistor (26) is adapted to produce a countersignal which at least at a location in the substrate or at the substrate surface corresponds in amplitude and frequency to at least one component of the interference signal and whose phase is shifted either through 180 degrees or through approximately 180 degrees with respect to the at least one component of the interference signal.

21. A semiconductor component as set forth in claim 19 wherein the first field electrode (28) is acted upon with a potential ($V_s$) whose magnitude is predetermined in dependence on at least one of the following parameters: the expected electrical field strength of the interference signal, the electrical conductivity of the substrate or at least one layer contained in the substrate, the dimensions of the second integrated circuit, and the component density in the first or second integrated circuit.

22. A semiconductor component as set forth in claim 19 wherein the shielding transistor (26) is arranged in the substrate between the first integrated circuit (16) and the second integrated circuit (18).

23. A semiconductor component as set forth in claim 19 wherein the countersignal circuit includes two or more shielding transistors.

* * * * *